US006784558B2

(12) United States Patent
Jassowski

(10) Patent No.: US 6,784,558 B2
(45) Date of Patent: Aug. 31, 2004

(54) SEMICONDUCTOR DEVICE INLCLUDING OPTIMIZED DRIVER LAYOUT FOR INTEGRATED CIRCUIT WITH STAGGERED BOND PADS

(75) Inventor: Michael A. Jassowski, El Dorado, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/618,381

(22) Filed: Jul. 11, 2003

(65) Prior Publication Data

US 2004/0056367 A1 Mar. 25, 2004

Related U.S. Application Data

(63) Continuation-in-part of application No. 09/475,643, filed on Dec. 30, 1999.

(51) Int. Cl.[7] ............................................. H01L 29/40
(52) U.S. Cl. ...................... 257/786; 257/202; 257/203; 257/207
(58) Field of Search ............................... 257/786, 202, 257/203, 207

(56) References Cited

U.S. PATENT DOCUMENTS

| 5,719,449 | A | * | 2/1998 | Strauss | 257/786 |
| 5,796,171 | A | * | 8/1998 | Koc et al. | 257/786 |
| 5,828,400 | A | * | 10/1998 | Fleming | 347/238 |
| 5,962,926 | A | * | 10/1999 | Torres et al. | 257/786 |
| 6,031,258 | A | * | 2/2000 | Ranjan et al. | 257/203 |
| 6,037,654 | A | * | 3/2000 | Tamura | 257/668 |
| 6,078,068 | A | * | 6/2000 | Tamura | 257/203 |
| 6,204,567 | B1 | * | 3/2001 | Imamura | 257/797 |
| 6,242,814 | B1 | * | 6/2001 | Bassett | 257/786 |
| 6,258,560 | B1 | * | 7/2001 | Leung et al. | 435/69.1 |
| 6,307,271 | B1 | * | 10/2001 | Nakamura | 257/786 |
| 6,323,548 | B1 | * | 11/2001 | Hiraga | 257/692 |

FOREIGN PATENT DOCUMENTS

| JP | 1-298731 | * | 12/1989 | 257/786 |
| JP | 5-235090 | * | 9/1993 | 257/786 |

* cited by examiner

*Primary Examiner*—Jasmine Clark
(74) *Attorney, Agent, or Firm*—Calvin E. Wells

(57) ABSTRACT

An embodiment of an integrated circuit die with staggered bond pads and optimized driver layout includes a staggered array of bond pads with an outer ring of bond pads and an inner ring of bond pads. Driver/ESD circuit cells for the outer ring of bond pads are located to the outside of the bond pads (between the outer ring of bond pads and the nearest die edge). The driver/ESD cells for the inner ring of bond pads are located to the inside of the bond pads (between the inner ring of bond pads and the die core). The integrated circuit die is coupled to a lead frame via bond wires.

16 Claims, 5 Drawing Sheets

SEMICONDUCTOR DEVICE INLCLUDING OPTIMIZED DRIVER LAYOUT FOR INTEGRATED CIRCUIT WITH STAGGERED BOND PADS

This application is a continuation-in-part of U.S. Ser. No. 09/475,643 entitled "Optimized Driver Layout for Integrated Circuits With Staggered Bond Pads" filed Dec. 30, 1999.

FIELD OF THE INVENTION

The present invention pertains to the field of computer systems. More particularly, this invention pertains to the field of integrated circuits with staggered bond pads.

BACKGROUND OF THE INVENTION

FIG. 1 shows a cross-sectional view of a portion of a typical ball grid array semiconductor device 100. Among the components of the typical ball grid array semiconductor device 100 is a die 110. The die 110 is coupled to a lead frame 120 via a bond wire 115. Although only a single bond wire is shown in FIG. 1, a typical semiconductor device may include dozens or hundreds of such bond wires. The lead frame 120 provides electrical pathways from the bond wires to the solder balls 140. Although this example shows only three solder balls, a typical ball grid array semiconductor device may include dozens or hundreds of such solder balls. A solder mask 150 provides electrical isolation between the various solder balls 140. The entire assembly is encapsulated in a plastic casing 130.

FIG. 2 is a block diagram of a portion of a prior integrated circuit die with staggered bond pads. The staggered bond pads are represented by blocks 210 through 217. The bond pads are arrayed in close proximity to the edge of the die (indicated by line 260). Although only eight bond pads are depicted in FIG. 2, a typical prior integrated circuit with staggered bond pads may include hundreds of such bond pads. The bond pads 210 through 217 when assembled into a complete semiconductor device would be connected to a lead frame via bond wires, as seen in the example of FIG. 1.

The bond pads 210 through 217 are electrically coupled to a series of driver/ESD circuit cells 220 through 227. The term "ESD" refers to "electrostatic discharge". The driver/ESD cells 220 through 227 provide drive strength for output signals, receive input signals, and also provide ESD protection. The driver/ESD cells 220 through 227 are coupled to the bond pads 210 through 217 via metal connections. Two of the metal connections are labeled 240 and 247. Metal connection 240 connects bond pad 210 to driver/ESD cell 220, and metal connection 247 connects bond pad 217 to driver/ESD cell 227. The driver/ESD cells 220 through 227 are connected to a series of pre-driver cells 230 through 237. These cells serve to couple the driver/ESD cells with the circuitry located at the die core.

Because the bond pads 210 through 217 are arranged in a staggered array, with an inner ring including bond pads 211, 213, 215, and 217 and with an outer ring including bond pads 210, 212, 214, and 216, the metal connections to the outer ring bond pads must be routed between the inner ring bond pads.

It is often advantageous for a semiconductor device manufacturer to reduce the size of a die in an effort to produce more devices per wafer, thus reducing manufacturing costs per device. If the number of bond pads on the die is not to decrease, then the bond pads must be placed in closer proximity one to another when the size of the die is reduced. This, in turn, results in a more narrow metal connection between the driver/ESD cells and the bond pads in the outer ring. Also, the width of the driver/ESD cells is reduced.

Several problems can arise as the width of the metal connections between the driver/ESD cells and the bond pads in the outer ring is reduced. A more narrow metal connection results in greater electrical resistance. The narrow connection may not be able to handle large currents that may occur as a result of an ESD event. The narrow metal connection may also experience electro-migration, which is a gradual erosion of the metal resulting in eventual circuit failure. One potential solution to the narrow metal connection problem may be to route additional metal on layers below the inner row of bond pads, but this potential solution raises a manufacturing problem of dielectric material that is typically deposited between metal layers cracking below the bond pads during installation of the bond wires.

In addition to the problems raised due to a reduction in width of the metal connections between the driver/ESD cells and the bond pads in the outer ring, a reduction in the width of the driver/ESD cells may make implementation of ESD protection structures within the driver/ESD cells more problematic.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

An embodiment of an integrated circuit die with staggered bond pads and optimized driver layout includes a staggered array of bond pads with an outer ring of bond pads and an inner ring of bond pads. Driver/ESD circuit cells for the outer ring of bond pads are located to the outside of the bond pads (between the outer ring of bond pads and the nearest die edge). The driver/ESD cells for the inner ring of bond pads are located to the inside of the bond pads.

Figure 1:
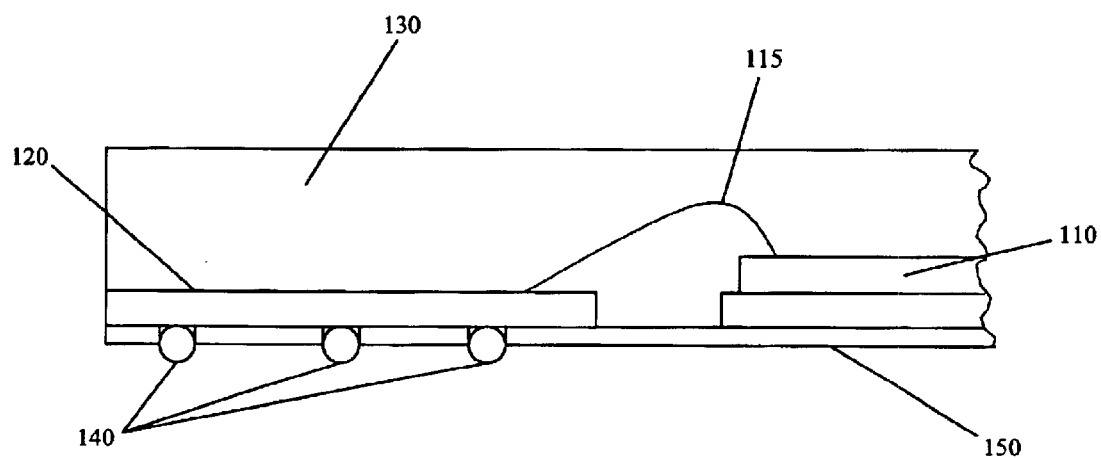
FIG. 1 is a cross-sectional view of a typical ball grid array semiconductor device.
Figure 2:
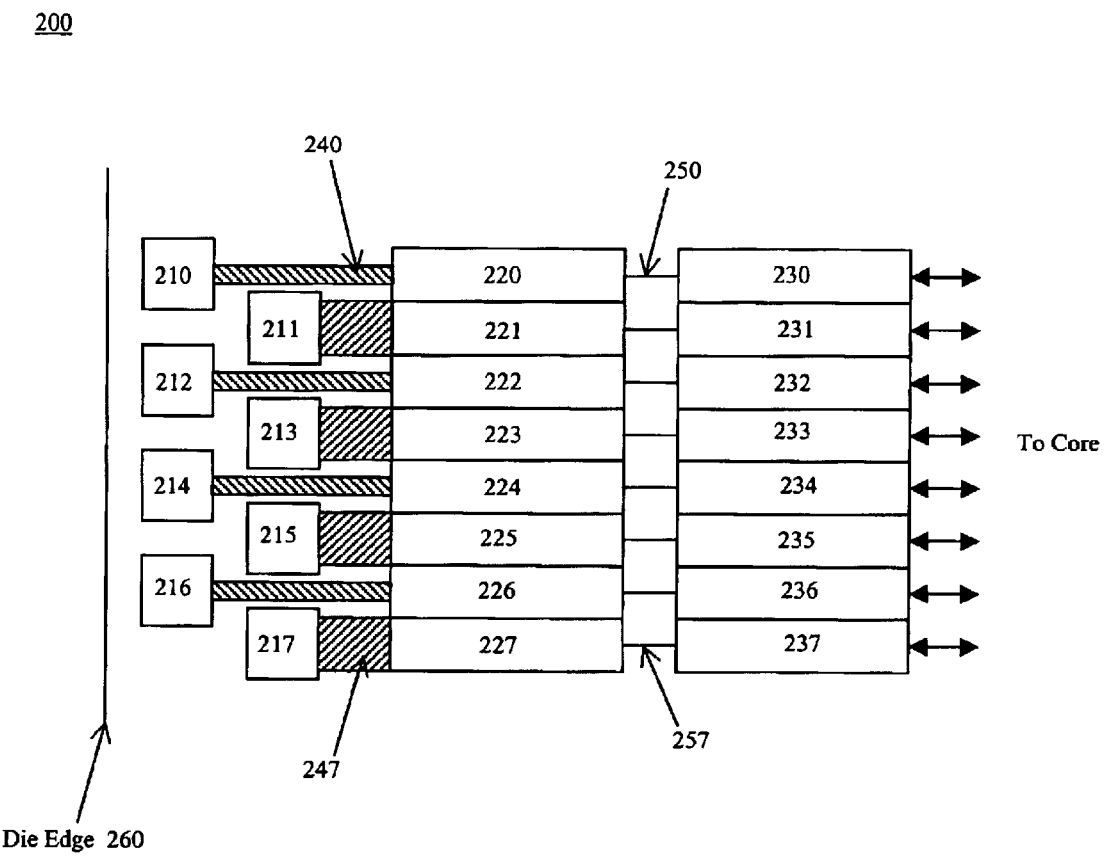
FIG. 2 is a block diagram of a portion of a prior art semiconductor die.
Figure 3:
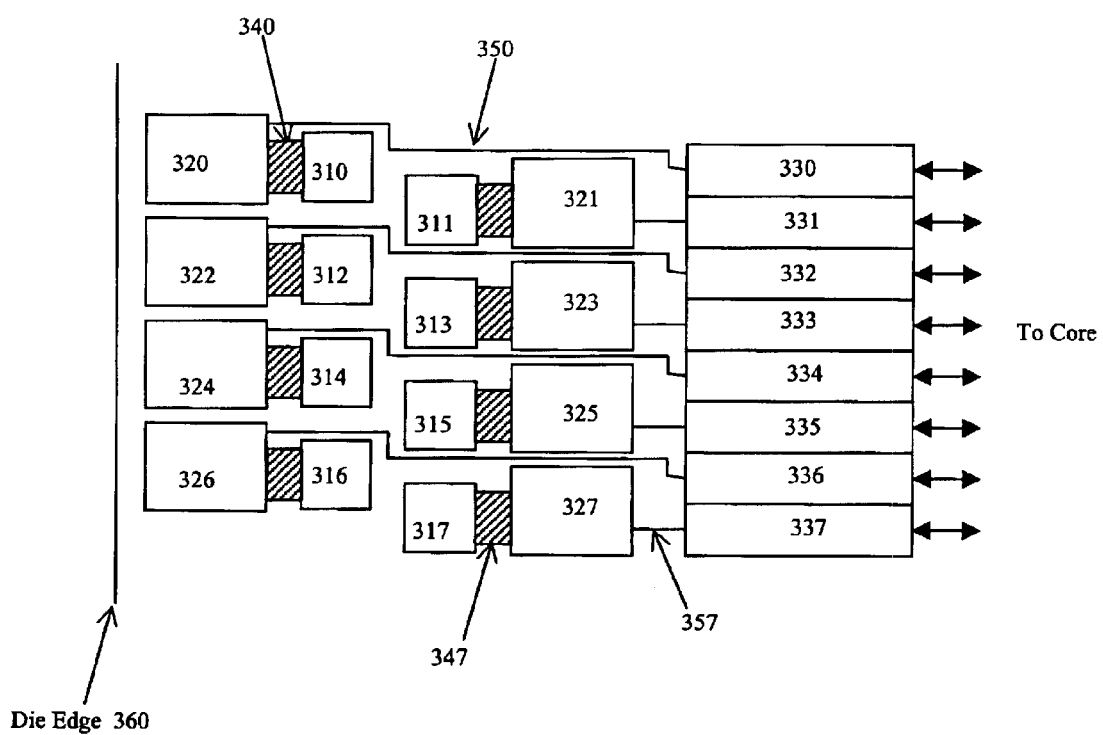
FIG. 3 is a block diagram of a portion of an embodiment of a semiconductor die configured in accordance with the invention.

FIG. 3 is block diagram of an embodiment of a staggered bond pad integrated circuit die 300 with optimized driver layout. The die 300 includes pre-driver/receiver circuit cells 330 through 337. The pre-driver/receiver cells 330 through 337 provide communication between the die core and a series of driver/ESD circuit cells 320 through 327. The driver/ESD circuit cells 320 through 327 provide drive strength, receive incoming signals, and provide ESD protection. The driver/ESD circuit cells 320 through 327 are coupled to bond pads 310 through 317. The driver/ESD circuit cells and the bond pads are connected via a series of metal connections, two of which are labeled 340 and 347. Although only eight bond pads, eight driver/ESD cells, and eight pre-driver/receiver cells are shown in FIG. 3 in order to avoid obscuring the invention, embodiments of the invention are possible with many more bond pads, driver/ESD cells, and pre-driver/receiver cells. Further, the driver/ESD cells 320 through 327 are meant to represent a broad range of possible input/output cell circuits.

The driver/ESD cells 320, 322, 324, and 326 are located to the outside of the bond pads 310 through 317. That is, the driver/ESD cells 320, 322, 324, and 326 are located between the bond pads 310, 312, 314, and 316 and the die edge 360. This driver/ESD cell layout has the advantage of allowing the metal connections between the bond pads 310, 312, 314, and 316 and their associated driver/ESD cells 320, 322, 324, and 326 to be as wide as the metal connections between the bond pads 311, 323, 325, and 327 and their associated drive/ESD cells 321, 323, 325, and 327. These metal connections may have a width of 80 microns, although other embodiments are possible with other metal connection widths. The driver/ESD layout of this example embodiment also allows the driver/ESD cells to have widths greater than those possible with prior integrated circuits.

The pre-driver/receiver cells 330 through 337 are electrically connected to the driver/ESD cells 320 through 327 by way of a series of electrically conductive paths, two of which have been labeled in FIG. 3 as 350 and 357. These electrically conductive paths may have a width of approximately 1 to 2 microns, although other embodiments are possible with other widths. The electrically conductive paths connecting pre-driver/receiver cells 330, 332, 334, and 336 to driver/ESD cells 320, 322, 324, and 326 may be routed between the bond pads 310 through 317 and between the driver/ESD cells 321, 323, 325, and 327. It is also possible to route these electrically conductive paths on another layer underneath the driver/ESD and bond pad structures. Because the electrically conductive paths between the pre-driver cells 330, 332, 334, and 336 and the driver/ESD cells 320, 322, 324, and 326 are relatively narrow, perhaps 1 or 2 microns in width, the electrically conductive paths may be routed underneath the bond pads without creating an additional risk of cracking inter layer dielectric material during installation of bond wires. Further, although FIG. 3 shows only one electrically conductive path between each pre-driver/receiver cell and its associated driver/ESD cell, other embodiments are possible with more than one electrically conductive path between each pre-driver/receiver cell and its associated driver/ESD cell.

Figure 4:
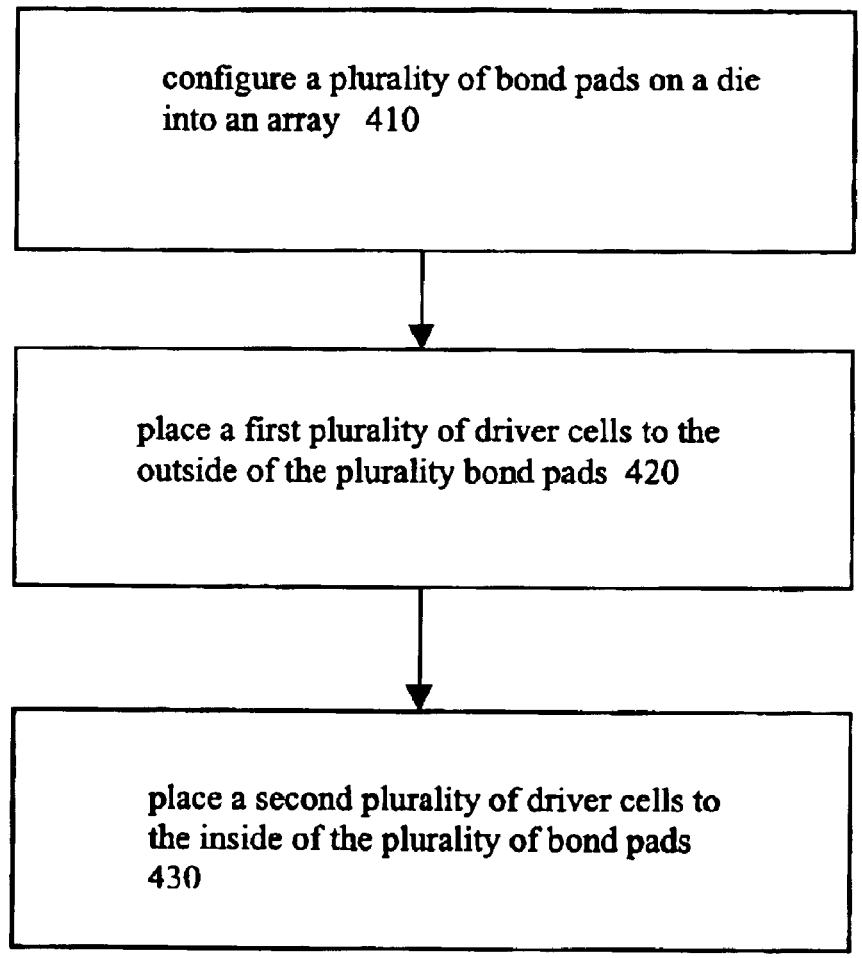
FIG. 4 is a flow diagram of an embodiment of a method for optimizing driver layout for integrated circuits with staggered bond pads.

FIG. 4 is a flow diagram of an embodiment of a method for optimizing driver cell layout in a staggered bond pad integrated circuit. At step 410, a plurality of bond pads on a die are configured into an array. At step 420, a first plurality of driver cells are placed to the outside of the plurality of bond pads. That is, the first plurality of driver cells are situated between the bond pads and the nearest edge of the die. At step 430, a second plurality of driver cells are placed to the inside of the plurality of bond pads. That is, the second plurality of driver cells are situated between the bond pads and the die core.

Figure 5:
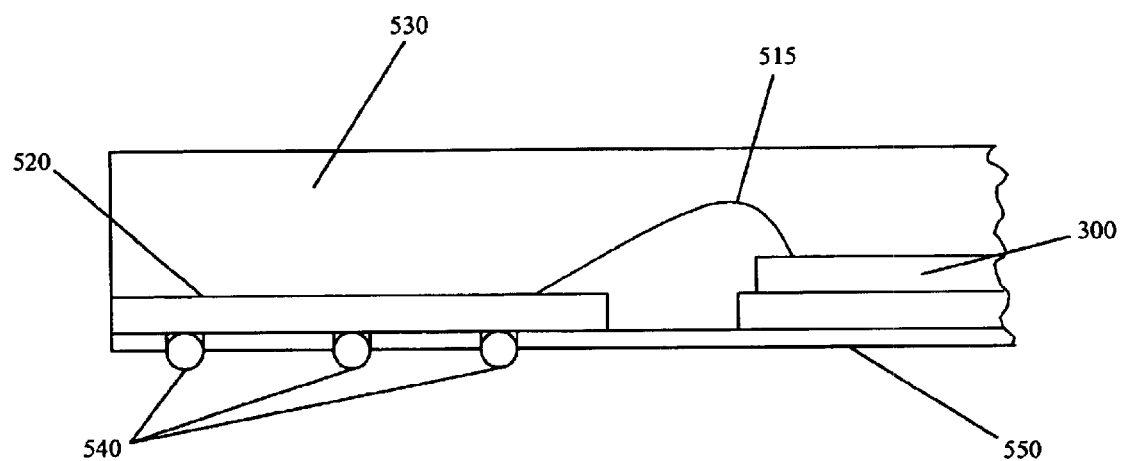
FIG. 5 is a cross-sectional view of a ball grid array semiconductor device including a semiconductor die implemented in accordance with the invention.

FIG. 5 shows a cross-sectional view of a portion of a ball grid array semiconductor device 500. Among the components of the ball grid array semiconductor device 500 is a die 300. The die 300 includes the various characteristics discussed above in connection with FIG. 3, including the optimized driver layout and the staggered bond pads. The die 300 is coupled to a lead frame 520 via a bond wire 515. Although only a single bond wire is shown in FIG. 5, embodiments of the semiconductor device 500 may include dozens or hundreds of such bond wires. The lead frame 520 provides electrical pathways from the bond wires to the solder balls 540. Although this example shows only three solder balls, embodiments of the ball grid array semiconductor device may include dozens or hundreds of such solder balls. A solder mask 550 provides electrical isolation between the various solder balls 540. The entire assembly is encapsulated in a plastic casing 530.

Although the semiconductor device 500 is described as including solder balls for providing electrical connections to a system, other embodiments are possible using other techniques for providing electrical connection to the system, including, but not limited to, pins or lead fingers.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than in a restrictive sense.

What is claimed is:

1. A semiconductor device, comprising:
a die including
a plurality of bond pads configured in an array,
a first plurality of driver cells located between a nearest die edge and the plurality of bond pads, and
a second plurality of driver cells located to the inside of the plurality of bond pads; and
a lead frame including a plurality of lead fingers, the plurality of lead fingers coupled the plurality of bond pads by a plurality of bond wires.

2. The semiconductor device of claim 1, wherein the plurality of bond pads are configured in a staggered array.

3. The semiconductor device of claim 2, further comprising a plurality of pre-drive cells located farther from the nearest die edge than the second plurality of driver cells.

4. The semiconductor device of claim 3, wherein the plurality of bond pads are configured in a staggered array including an inner ring and an outer ring of bond pads.

5. The semiconductor device of claim 4, further comprising a plurality of metal connections, each of the plurality of metal connections to couple one of the first and second pluralities of driver cells to one of the plurality of bond pads.

6. The semiconductor device of claim 5, further comprising a plurality of conductive interconnects, each of the plurality of pre-driver cells coupled to one of the first and second pluralities of driver cells by at least one of the plurality of conductive interconnects.

7. The semiconductor device of claim 6, wherein each of the plurality of conductive interconnects is substantially more narrow in width than each of the plurality of metal connections.

8. The semiconductor device of claim 7, wherein the first and second pluralities of driver cells each have a width of approximately 80 microns.

9. A semiconductor device, comprising:
a die including a plurality of bond pads configured in an array, a first plurality of driver cells located between a nearest die edge and the plurality of bond pads, and a second plurality of driver cells located to the inside of the plurality of bond pads; and a lead frame including a plurality of solder balls, the plurality of solder balls coupled the plurality of bond pads by a plurality of bond wires.

10. The semiconductor device of claim 9, wherein the plurality of bond pads are configured in a staggered array.

11. The semiconductor device of claim 10, further comprising a plurality of pre-drive cells located farther from the nearest die edge than the second plurality of driver cells.

12. The semiconductor device of claim 11, wherein the plurality of bond pads are configured in a staggered array including an inner ring and an outer ring of bond pads.

13. The semiconductor device of claim 12, further comprising a plurality of metal connections, each of the plurality of metal connections to couple one of the first and second pluralities of driver cells to one of the plurality of bond pads.

14. The semiconductor device of claim 13, further comprising a plurality of conductive interconnects, each of the plurality of pre-driver cells coupled to one of the first and second pluralities of driver cells by at least one of the plurality of conductive interconnects.

15. The semiconductor device of claim 14, wherein each of the plurality of conductive interconnects is substantially more narrow in width than each of the plurality of metal connections.

16. The semiconductor device of claim 15, wherein the first and second pluralities of driver cells each have a width of approximately 80 microns.

* * * * *